United States Patent [19]

Doke et al.

[11] Patent Number: 5,614,842

[45] Date of Patent: Mar. 25, 1997

[54] SEMICONDUCTOR INTEGRATED CIRCUIT WITH BUFFER CIRCUIT AND MANUFACTURING METHOD THEREOF

[75] Inventors: Katsuro Doke, Yokohama; Toshikazu Sei; Yasunobu Umemoto, both of Kawasaki; Eiji Ban, Yokohama, all of Japan

[73] Assignee: Kabushiki Kaisha Toshiba, Kawasaki, Japan

[21] Appl. No.: 522,962

[22] Filed: Sep. 1, 1995

[30] Foreign Application Priority Data

Sep. 2, 1994 [JP] Japan .................. 6-210109

[51] Int. Cl.$^6$ .................. H03K 19/0948; H03K 19/00
[52] U.S. Cl. .................. 326/58; 326/83; 326/87
[58] Field of Search .................. 326/57–58, 83, 326/86–87, 121, 21

[56] References Cited

U.S. PATENT DOCUMENTS

| | | | |
|---|---|---|---|
| 4,680,487 | 7/1987 | Kobayashi | 326/58 |
| 4,697,107 | 9/1987 | Haines | 326/58 |
| 5,450,356 | 9/1995 | Miller | 326/58 |

FOREIGN PATENT DOCUMENTS

| | | | |
|---|---|---|---|
| 2-5613 | 1/1990 | Japan | 326/58 |
| 2-54617 | 2/1990 | Japan | 326/58 |
| 3-82218 | 4/1991 | Japan . | |
| 5-259879 | 10/1993 | Japan . | |

*Primary Examiner*—Edward P. Westin
*Assistant Examiner*—Jon Santamauro
*Attorney, Agent, or Firm*—Foley & Lardner

[57] ABSTRACT

A semiconductor integrated circuit with a buffer circuit is disclosed. The source of the first P(N)MOS transistor is connected to a voltage supply (ground), its drain being connected to an output terminal. The source of the first N(P)MOS transistor is connected to the ground (voltage supply), its drain being connected to the output terminal. The gate of the second P(N)MOS transistor is connected to the gate of the first NMOS transistor, its source being connected to the voltage supply (ground) and its drain being connected to the output terminal. The gate of the second N(P)MOS transistor is connected to the gate of the first PMOS transistor, at least one of its source and drain being floated. A controller responses to an enable signal and an input signal to apply control signals to the gates of the first PMOS and NMOS transistors. By these control signals, any one of the first PMOS and NMOS transistors is turned on based on the input signal level when the enable signal is on. Whereas both the first PMOS and NMOS transistors are turned off irrespective of the input signal level when the enable signal is off. The semiconductor integrated circuit further includes an input buffer connected the output terminal via a resistor. The input buffer applies a signal appearing at the output terminal to internal circuitry of the semiconductor integrated circuit.

13 Claims, 7 Drawing Sheets

001
SEMICONDUCTOR INTEGRATED CIRCUIT WITH BUFFER CIRCUIT AND MANUFACTURING METHOD THEREOF

BACKGROUND OF THE INVENTION

1. Field of the Invention

The present invention relates to a semiconductor integrated circuit and a method of manufacturing the same. More specifically, the present invention relates to a semiconductor integrated circuit provided with a buffer circuit and a method of manufacturing the same semiconductor integrated circuit.

2. Description of the Prior Art

There is a conventional semiconductor integrated circuit provided with a bidirectional buffer circuit having a pull-up circuit.

Figure 1:
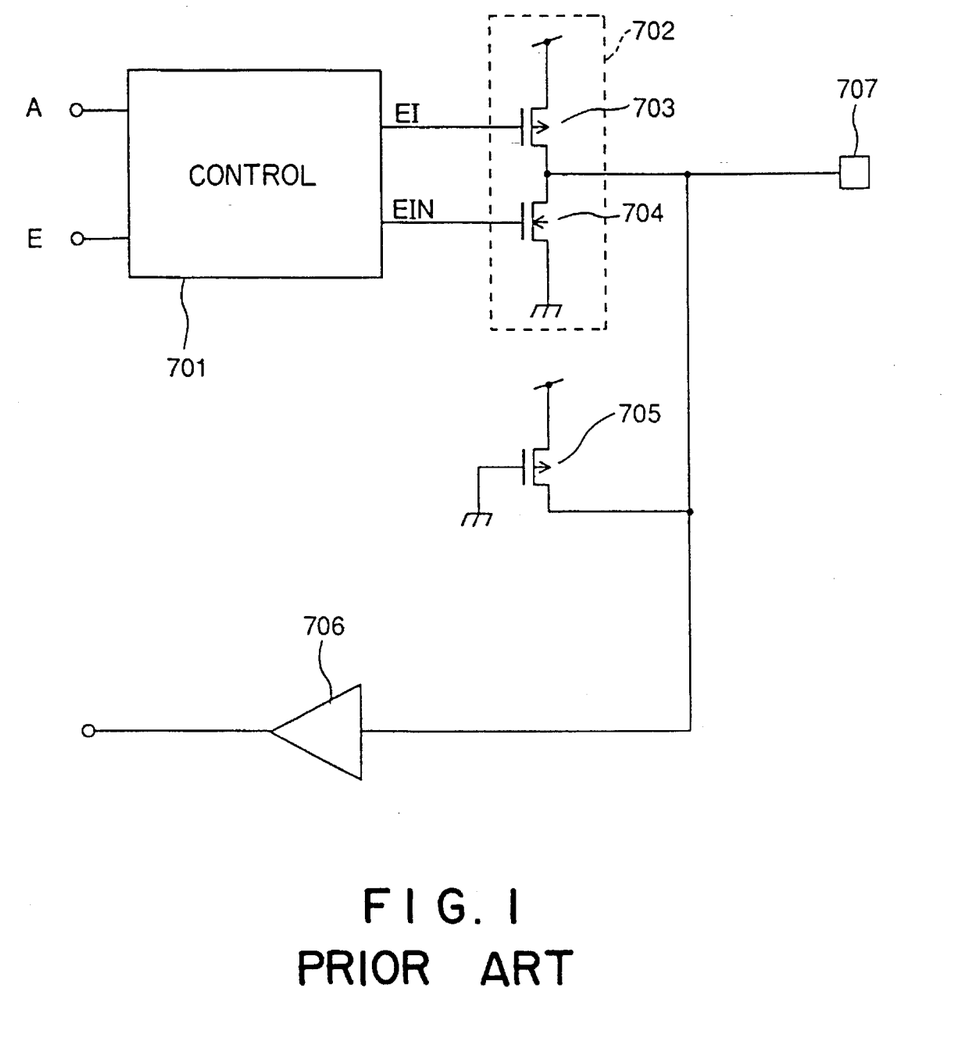
FIG. 1 is a circuit diagram showing an example of conventional semiconductor integrated circuit provided with a bidirectional buffer circuit having a pull-up circuit.

FIG. 1 is a circuit diagram showing an example of such a conventional semiconductor integrated circuit. In this circuit, when an enable signal B is at a low level, a control circuit 701 outputs low-level output signals EI and EIN in response to a high-level input signal A, whereas high-level output signals EI and EIN in response to a low-level input signal A. On the other hand, when the enable signal E is at a high level, the control circuit 701 outputs a high-level output signal EI and a low-level output signal EIN, irrespective of the input signal level.

A PMOS transistor 703 and an NMOS transistor 704 constitute an output buffer circuit 702 that is connected to the control circuit 701. When the low-level output signal EI of the control circuit 701 is applied to the gate of the PMOS transistor 703, the PMOS transistor 703 is turned on, so that a supply potential supplied to the source of the transistor 703 is applied to an output terminal 707. On the other hand, when the output signal EI of the control circuit 701 is at the high level, the PMOS transistor 703 is turned off. In contrast with this, when the high-level output signal EIN of the control circuit 701 is applied to the gate of the NMOS transistor 704, the NMOS transistor 704 is turned on, so that a ground potential is applied to the output terminal 707. On the other hand, when the output signal EIN of the control circuit 701 is at the low level, the PMOS transistor 704 is turned off.

Further, in FIG. 1, a PMOS transistor 705 acts as a pull-up circuit 705. Here, since the gate of the PMOS transistor 705 is grounded, this PMOS transistor 705 is always kept turned on, so that a supply potential supplied to its source is always applied to the output terminal 707.

Further, an input buffer circuit 706 outputs a signal inputted through the output terminal 707 to internal circuitry (not shown) of the semiconductor integrated circuit.

In the above-mentioned conventional integrated circuit, when the enable signal E is at the low level and when the input signal A is at the high level, since the output signal of the output buffer 702 changes to the high level, the output terminal 707 changes also to the high potential level. Further, when the enable signal E is at the low level and when the input signal A is also at the low level, since the output signal of the output buffer 702 changes to the low level, the output terminal 707 changes also to the low potential level. On the other hand, when the enable signal E is at the high level, although the output of the output buffer 702 is not decided, since being pulled up by the PMOS transistor 705, the potential at the output terminal 707 is kept at the high level.

In the above-mentioned conventional semiconductor integrated circuit provided with the buffer circuit shown in FIG. 1, however, even when the output signal of the output buffer circuit 702 is at the low level, the PMOS transistor 705 is always kept turned on. There exists a problem in that current flows from the supply potential connected to the source of the PMOS transistor 705 to the ground through the two turn-on MOS transistors 705 and 704. This through current increases power consumption of the semiconductor integrated circuit.

SUMMARY OF THE INVENTION

With the problem in mind therefore, it is the object of the present invention to provide a semiconductor integrated circuit including a buffer circuit of low power consumption.

To achieve the above-mentioned object, the present invention provides a semiconductor integrated circuit, comprising: a first MOS transistor of a first-conductive type having a gate, a source connected to a first voltage supply and a drain connected to an output terminal; a second MOS transistor of a second-conductive type different from the first-conductive type having a gate, a source connected to a second voltage supply different from the first voltage supply in potential and a drain connected to the output terminal; a third MOS transistor of the first-conductive type having a gate connected to the gate of the second MOS transistor, a source connected to the first voltage supply and a drain connected to the output terminal; a fourth MOS transistor of the second-conductive type having a source, a drain and a gate connected to the gate of the first MOS transistor, at least one of the source and drain being floated; and means, responsive to an enable signal and an input signal, for applying control signals to the gates of the first and second MOS transistors to turn on any one of the first and second MOS transistors based on the input signal level when the enable signal is on, whereas to turn off both the first and second MOS transistors irrespective of the input signal level when the enable signal is off.

Further, the present invention provides a semiconductor integrated circuit, comprising: a first MOS transistor of a first-conductive type having a drain, a source connected to a first voltage supply and a drain connected to an output terminal; a second MOS transistor of a second-conductive type different from the first-conductive type having a gate, a source connected to a second voltage supply different from the first voltage supply in potential and a drain connected to an output terminal; a third MOS transistor of the first-conductive type having a source, a drain and a gate connected to the gate of the second MOS transistor, at least one of the source and drain being floated; a fourth MOS transistor of the second-conductive type having a source, a drain and a gate connected to a gate of the first MOS transistor, at least one of the source and drain being floated; and means, responsive to an enable signal and an input signal, for applying control signals to the gates of the first and second MOS transistors to turn on any one of the first and second MOS transistors based on the input signal level when the enable signal is on, whereas to turn off both the first and second MOS transistors irrespective of the input signal level when the enable signal is off.

The semiconductor integrated circuits may further include means for applying a signal appearing at the output terminal to their internal circuitry. In the semiconductor integrated circuits, the first and third transistors may be PMOS transistors and the second and fourth transistors may be NMOS transistors.

Further, the present invention provides a method of manufacturing a semiconductor integrated circuit including a first MOS transistor of a first-conductive type having a gate, a source connected to a first voltage supply and a drain connected to an output terminal, a second MOS transistor of a second-conductive type different from the first-conductive type having a gate, a source connected to a second voltage supply different from the first voltage supply in potential and a drain connected to the output terminal, a third MOS transistor of the first-conductive type having a gate connected to the gate of the second MOS transistor, a source connected to the first voltage supply and a drain connected to the output terminal and a fourth MOS transistor of the second-conductive type having a source connected to the second voltage supply, a drain connected to the output terminal and a gate connected to the gate of the first MOS transistor, the method comprising the step of: cutting off at least one of wiring connected between the source of the third MOS transistor and the first voltage supply, wiring connected between the drain of the third MOS transistor and the output terminal, wiring connected between the source of the fourth MOS transistor and the second voltage supply, and wiring connected between the drain of the fourth MOS transistor and the output terminal.

Further, the present invention provides a semiconductor integrated circuit, comprising: a first PMOS transistor having a gate, a source connected to a voltage supply and a drain connected to an output terminal; a first NMOS transistor having a gate, a source connected to a ground and a drain connected to the output terminal; a second PMOS transistor having a gate connected to the gate of the first NMOS transistor, a source connected to the voltage supply and a drain connected to the output terminal via a resistor; a second NMOS transistor having a source, a drain and a gate connected to the gate of the first PMOS transistor, at least one of the source and drain being floated; a NAND gate having one input accepting an input signal and an output connected to the gate of the first PMOS transistor; a NOR gate having one input connected to the one input of the NAND gate, an another input accepting an enable signal and an output connected to the gate of the first NMOS transistor; and an inverter having an input connected to the other input of the NOR gate and an output connected to an another input of the NAND gate, wherein any one of the first PMOS and NMOS transistors is turned on based on the input signal level when the enable signal is substantially at the ground level, whereas the first PMOS and NMOS transistors are both turned off irrespective of the input signal level when the enable signal is substantially at the supply voltage level.

The semiconductor integrated circuit with the floating second NMOS transistor may further include an input buffer connected to the drain of the second PMOS transistor, for applying a signal appearing at the output terminal to the internal circuitry.

Further, the present invention provides a semiconductor integrated circuit, comprising: a first PMOS transistor having a gate, a source connected to a voltage supply and a drain connected to an output terminal; a first NMOS transistor having a gate, a source connected to a ground and a drain connected to the output terminal; a second PMOS transistor having a source, a drain and a gate connected to the gate of the first NMOS transistor, at least one of the source and drain being floated; a second NMOS transistor having a gate connected to the gate of the first PMOS transistor, a source connected to the ground and a drain connected to the output terminal via a resistor; a NAND gate having one input accepting an input signal and an output connected to the gate of the first PMOS transistor; a NOR gate having one input connected to the one input of the NAND gate, an another input accepting an enable signal and an output connected to the gate of the first NMOS transistor; and an inverter having an input connected to the other input of the NOR gate and an output connected to the an another input of the NAND gate, wherein any one of the first PMOS and NMOS transistors is turned on based on the input signal level when the enable signal is substantially at the ground level, whereas the first PMOS and NMOS transistors are both turned off irrespective of the input signal level when the enable signal is substantially at the supply voltage level.

The semiconductor integrated circuit with the floating second PMOS transistor may further include an input buffer connected to the drain of the second NMOS transistor, for applying a signal appearing at the output terminal to the internal circuitry.

Further, the present invention provides a semiconductor integrated circuit, comprising: a first PMOS transistor having a gate, a source connected to a voltage supply and a drain connected to an output terminal; a first NMOS transistor having a gate, a source connected to a ground and a drain connected to the output terminal; a second PMOS transistor having a source, a drain and a gate connected to the gate of the first NMOS transistor, at least one of the source and drain being floated; a second NMOS transistor having a source, a drain and a gate connected to the gate of the first PMOS transistor, at least one of the source and drain being floated; a NAND gate having one input accepting an input signal and an output connected to the gate of the first PMOS transistor; a NOR gate having one input connected to the one input of the NAND gate, an another input accepting an enable signal and an output connected to the gate of the first NMOS transistor; and an inverter having an input connected to the other input of the NOR gate and an output connected to an another input of the NAND gate, wherein any one of the first PMOS and NMOS transistors is turned on based on the input signal level when the enable signal is substantially at the ground level, whereas the first PMOS and NMOS transistors are both turned off irrespective of the input signal level when the enable signal is substantially at the supply voltage level.

The semiconductor integrated circuit with the floating second PMOS and NMOS transistors may further include an input buffer connected to the output terminal via a resistor, for applying a signal appearing at the output terminal to internal circuitry of the semiconductor integrated circuit.

Further, the present invention provides a semiconductor integrated circuit, comprising: a first PMOS transistor having a gate, a source connected to a voltage supply and a drain connected to an output terminal; a first NMOS transistor having a gate, a source connected to a ground and a drain connected to the output terminal; a NAND gate having one input accepting an input signal and an output connected to the gate of the first PMOS transistor; a NOR gate having one input connected to the one input of the NAND gate, an another input accepting an enable signal and an output connected to the gate of the first NMOS transistor; an inverter having an input connected to the other input of the NOR gate and an output connected to an another input of the NAND gate; and a second NMOS transistor having a gate connected to the input of the inverter, a drain connected to the output terminal via a resistor and a source connected to the ground, wherein any one of the first PMOS and NMOS transistors is turned on based on the input signal level when the enable signal is substantially at the ground level, whereas the first PMOS and NMOS transistors are both turned off irrespective of the input signal level when the enable signal is substantially at the supply voltage level.

The semiconductor integrated circuit with no floating transistor may further include an input buffer connected to the drain of the second NMOS transistor, for applying a signal appearing at the output terminal to internal circuitry of the semiconductor integrated circuit.

DETAILED DESCRIPTION OF THE EMBODIMENTS

The preferred embodiments of the semiconductor integrated circuit according to the present invention will be described hereinbelow with reference to the attached drawings.

The first preferred embodiment of the present invention will be described hereinbelow with reference to FIG. 2, in which a bidirectional buffer circuit having a pull-up circuit is shown.

Figure 2:
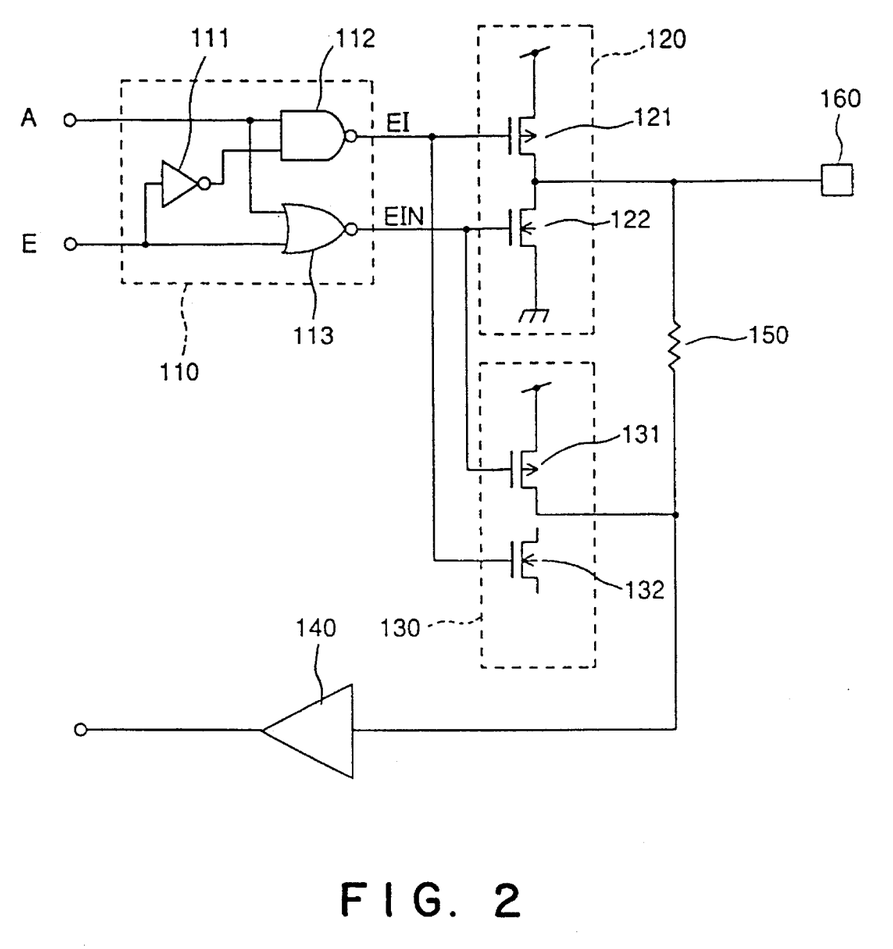
FIG. 2 is a circuit diagram showing the first preferred embodiment of the semiconductor integrated circuit according to the present invention, in which the bidirectional buffer circuit has a pull-up circuit.

In FIG. 2, the circuit includes a control circuit 110, an output buffer circuit 120, a pull-up circuit 130, and an input buffer circuit 140. The control circuit 110 includes a NOT (inverter) circuit 111, a NAND circuit 112 and a NOR circuit 113. The NAND circuit 112 accepts a signal/E obtained by inverting an enable signal E through the NOT circuit 111 and a signal A, and outputs an inverted control signal EI of a logical product of both the signals/E and A. Further, the NOR circuit 113 accepts the enable signal E and the signal A, and outputs an inverted control signal EIN of a logical sum of both the signals E and A. Therefore, when the enable signal E is at the low level, the control circuit 110 outputs low-level output signals EI and EIN in response to the high-level input signal A, whereas high-level output signals EI and EIN in response to the low-level input signal A. On the other hand, when the enable signal E is at the high level, the control circuit 110 outputs a high-level output signal EI and a low-level output signal EIN, irrespective of the level of the input signal A.

The output buffer circuit 120 includes a PMOS transistor 121 (the first MOS transistor) and an NMOS transistor 122 (the second MOS transistor). The source of the PMOS transistor 121 is connected to a voltage supply (the first voltage supply) and its drain is connected to an output terminal 160. The signal EI is inputted from the control circuit 110 to the gate of the PMOS transistor 121. Further, the source of the NMOS transistor 122 is connected to a ground voltage (the second voltage supply) and its drain is connected to the output terminal 160. The signal EIN is inputted from the control circuit 110 to the gate of the NMOS transistor 122. The PMOS transistor 121 is turned on when the low-level signal EI is applied from the control circuit 110 to the gate of the PMOS transistor 121. The supply potential supplied to the source of the PMOS transistor 121 is thus applied to the output terminal 160. On the other hand, when the signal EI is at the high level, the PMOS transistor 121 is turned off. The NMOS transistor 122 is turned on when the high-level signal EIN is applied from the control circuit 110 to the gate of the NMOS transistor 122. The ground potential is thus applied to the output terminal 160. On the other hand, when the signal EIN is at the low level, the NMOS transistor 122 is turned off.

The pull-up circuit 130 includes a PMOS transistor 131 (the third MOS transistor) and an NMOS transistor 132 (the fourth transistor). The source of the PMOS transistor 131 is connected to the voltage supply, its drain is connected to the output terminal 160 through a resistor 150 and its gate is connected to the gate of the NMOS transistor 122. Further, the gate of the NMOS transistor 132 is connected to the gate of the PMOS transistor 121 and its source and drain (at least one of them) are floated. The PMOS transistor 131 is turned on when the low-level signal EIN is applied from the control circuit 110 to the gate of the PMOS transistor 131. The supply potential supplied to the source of the PMOS transistor 131 is thus applied, through the resistor 150, to the output terminal 160. On the other hand, when the signal EIN is at the high level, the PMOS transistor 131 is turned off. The NMOS transistor 132 is inoperative because its source and drain are both floated.

The input buffer circuit 140 is connected to the output circuit 160 through the resistor 150, so that a signal inputted through the output terminal 160 is transmitted to internal circuitry (not shown) of the semiconductor integrated circuit.

The operation of the bidirectional buffer circuit having a pull-up circuit shown in FIG. 2 will be described hereinbelow.

When the enable signal E is at the low level and when the input signal A is at the high level, since both the output signals EI and EIN of the control circuit 110 are at the low level as already described, the PMOS transistor 121 is turned on and the NMOS transistor 122 is turned off. Further, since the signal EIN is at the low level, the PMOS transistor 131 is also turned on. As a result, the supply potential can be applied to the output terminal 160 through the two PMOS transistors 121 and 131.

Further, when both the enable signal E and the input signal A are at the low level, since both the output signals EI and EIN of the control circuit 110 are at the high level, the PMOS transistor 121 is turned off and the NMOS transistor 122 is turned on. Further, since the signal EIN is at the high level, the PMOS transistor 131 is also turned off. As a result, the ground potential can be applied to the output terminal 160 through the NMOS transistor 122.

Further, when the enable signal E is at the high level, since the output signal EIN of the control circuit 110 is at the low level, the PMOS transistor 121 and the NMOS transistor 122 are both turned off. On the other hand, the PMOS transistor 131 is turned on since the output signal EIN is at the low level. The supply potential thus can be applied to the output terminal 160 through the PMOS transistor 131 to pull up the potential at the output terminal 160.

As described above, in the bidirectional buffer circuit having the pull-up circuit shown in FIG. 2, the PMOS transistor 131 is turned off when the NMOS transistor 122 is turned on. There is thus no through current that flows, via the PMOS transistor 131 and NMOS transistor 122 to the ground, so that the power consumption of the circuit can be saved.

In the bidirectional buffer circuit having the pull-up circuit as shown in FIG. 2, since the gate of the PMOS transistor 131 is connected to the gate of the NMOS transistor 122, a load applied to the gate of the NMOS transistor 122 increases. This results in the operating speed of the NMOS transistor 122 being lowered. Therefore, in FIG. 2, the gate of the inoperative NMOS transistor 132 is connected to the gate of the PMOS transistor 121 to equalize the load applied to the gate of the PMOS transistor 121 to that of the NMOS transistor 122. In other words, since the operating speed of the NMOS transistor 122 can be equalized to that of the PMOS transistor 121 by the connection of the inoperative NMOS transistor 132, it is possible to obtain a constant operating speed of the bidirectional buffer circuit, irrespective of whether the high- or low-level signal is outputted from the output terminal 160. However, when it is unnecessary to equalize the operating speed of the bidirectional buffer circuit for both the high- and low-level signals, the NMOS transistor 132 is of course unnecessary.

In FIG. 2, the transistors 121 and 131 are of PMOS type and the transistors 122 and 132 are of NMOS type. However, the former may be of NMOS type and the latter may be of PMOS type. In this case, the output signals EI and EIN of the control circuit 110 will be applied to a PMOS transistor 122 and an NMOS transistor 121, respectively. This exchange of conductive types of MOS transistors can be applied to every circuit described later.

The method of manufacturing the bidirectional buffer circuit having the pull-up circuit shown in FIG. 2 will be described hereinbelow. To manufacture the bidirectional buffer circuit having the pull-up circuit, a circuit as shown in FIG. 3 is first formed on a semiconductor substrate by a well known manufacturing method.

Figure 3:
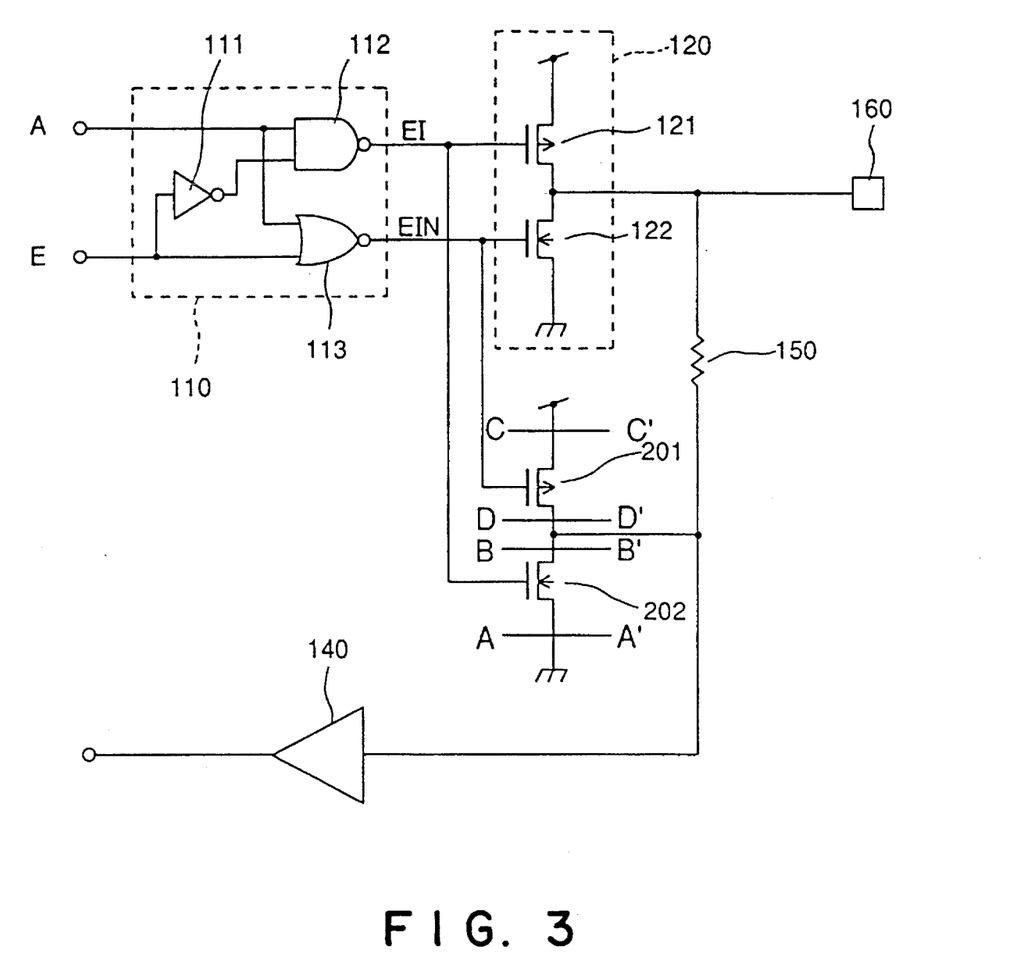
FIG. 3 is a circuit diagram for assistance in explaining the manufacturing method of the first embodiment of the semiconductor integrated circuit shown in FIG. 2, in which the state where the wiring is not yet cut off is shown.

In FIG. 3, the same reference numerals have been retained for the similar composing elements shown in FIG. 2. The source of a PMOS transistor 201 (the third transistor) in FIG. 3 is connected to the voltage supply (the first voltage supply), its drain is connected to the output terminal 160 and its gate is connected to the gate of the NMOS transistor 122. Further, the source of an NMOS transistor 202 (the fourth transistor) is connected to the ground (the second voltage supply), its drain is connected to the output terminal 160 and its gate is connected to the gate of the PMOS transistor 121.

In the circuit wiring shown in FIG. 3, the positions as shown by the lines A–A' and B–B' are both cut off, that is, the source of the NMOS transistor 202 is cut away from the ground and its drain is cut away from the output terminal 160, to obtain the circuit construction as shown in FIG. 2. In this case, it is also sufficient when any one of both is cut off.

As described above, after the wiring of the source and drain of the NMOS transistor 202 has been completed, the NMOS transistor 202 (in which the source and/or drain is floated) can be formed by simply cutting off the above-mentioned wires. Therefore, when the disconnected wire is required to be reconnected, the cut-off wiring can be connected again by use of FIB (Focused Ion Beam). In other words, it is possible to easily change the pull-up circuit 130 shown in FIG. 2 to a pull-down circuit (described later in further detail with reference to FIG. 4). As a result, whenever the pull-up circuit 130 is required to be changed to the pull-down circuit, it is unnecessary to manufacture the semiconductor integrated circuit with the pull-down circuit from the beginning, so that the manufacturing cost of the semiconductor integrated circuit can be reduced.

The second preferred embodiment of the present invention will be described hereinbelow with reference to FIG. 4, in which a bidirectional buffer circuit having a pull-down circuit is shown.

Figure 4:
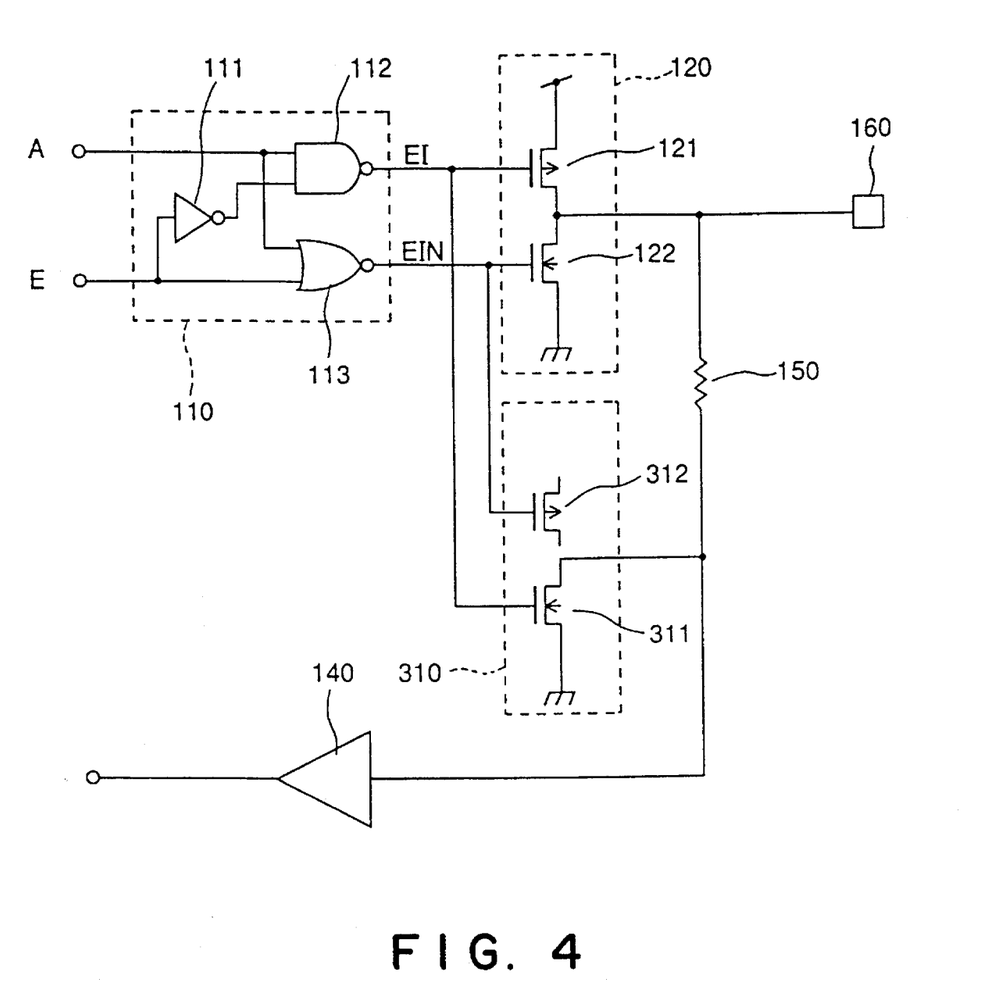
FIG. 4 is a circuit diagram showing the second preferred embodiment of the semiconductor integrated circuit according to the present invention, in which the bidirectional buffer circuit has a pull-down circuit.

In FIG. 4, the same reference numerals have been retained for the similar composing elements which have the same functions as with the case shown in FIG. 2.

A pull-down circuit 310 shown in FIG. 4 includes an NMOS transistor 311 (the third MOS transistor) and a PMOS transistor 312 (the fourth transistor). The source of the NMOS transistor 311 is connected to the ground (the first voltage supply), its drain is connected to the output terminal 160 through the resistor 150 and its gate is connected to the gate of the PMOS transistor 121 (the second MOS transistor). Further, the gate of the PMOS transistor 312 is connected to the gate of the NMOS transistor 122 (the first MOS transistor) and its source and drain (at least one of them) are floated. Therefore, the NMOS transistor 311 is turned on when the high-level signal EI is applied from the control circuit 110 to the gate of the NMOS transistor 311. The ground potential is thus applied to the output terminal 160. On the other hand, when the signal EI is at the low level, the NMOS transistor 311 is turned off. The PMOS transistor 312 is inoperative because its source and drain are both floated.

The operation of the bidirectional buffer circuit shown in FIG. 4 will be described hereinbelow.

When the enable signal E is at the low level and when the input signal A is at the high level, the output signals EI and EIN of the control circuit 110 are both at the low level. Thus, the PMOS transistor 121 is turned on and the NMOS transistor 122 is turned off. Further, the NMOS transistor 311 is also turned off. As a result, the supply potential can be applied to the output terminal 160 through the PMOS transistors 121.

Further, when both the enable signal E and the input signal A are at the low level, the output signals EI and EIN of the control circuit 110 are both at the high level. Thus, the PMOS transistor 121 is turned off and the NMOS transistor 122 is turned on. Further, NMOS transistor 311 is turned on. As a result, the ground potential can be applied to the output terminal 160 through the two turn-on NMOS transistors 122 and 311.

Further, when the enable signal E is at the high level, the output signal EI of the control circuit 110 is at the high level and its output signal EIN is at the low level. Thus, the PMOS transistor 121 and the NMOS transistor 122 are both turned off. On the other hand, since the output signal EI is at the low level, the NMOS transistor 311 is turned on. This results in the ground potential being applied to the output terminal 160 through the NMOS transistor 311 to pull down the potential at the output terminal 160.

As described above, in the bidirectional buffer circuit having the pull-down circuit shown in FIG. 4, when the PMOS transistor 121 is turned on, the NMOS transistor 131 can be turned off. Thus, there is no through current that flows via the NMOS transistor 311 and the NMOS transistor 122 to the ground. Consequently, the circuit power consumption can be reduced.

Further, in the same way as with the circuit shown in FIG. 2, since the gate of the NMOS transistor 311 is connected to the gate of the PMOS transistor 121, a load applied to the gate of the PMOS transistor 121 increases. This results in the operating speed of the PMOS transistor 121 being lowered. However, as shown in FIG. 4, the gate of the inoperative PMOS transistor 312 is connected to the gate of the NMOS transistor 122 to equalize the load applied to the gate of the PMOS transistor 121 to that of the NMOS transistor 122. In other words, since the operating speed of the NMOS transistor 122 can be equalized to that of the PMOS transistor 121 by the connection of the inoperative NMOS transistor 312, it is possible to obtain a constant operating speed of the bidirectional buffer circuit, irrespective of whether the high- or low-level signal is outputted from the output terminal 160. However, when it is unnecessary to equalize the operating speed of the bidirectional buffer circuit for both the high- and low-level signal, the NMOS transistor 312 is of course unnecessary.

When the bidirectional buffer circuit having the pull-down circuit as shown in FIG. 4 is manufactured, a circuit as shown in FIG. 3 is first formed on a semiconductor substrate. After that, in the circuit wiring shown in FIG. 3, the positions as shown by the lines C–C' and D–D' are both cut off, that is, the source of the PMOS transistor 201 (312) is cut away from the voltage supply, and its drain is cut away from the output terminal 160, to obtain the circuit construction as shown in FIG. 4. In this case, it is also sufficient when any one of both is cut off.

As described above, in the second preferred embodiment, after the wiring of the source and the drain of the PMOS transistor 201 (312) has been completed, the PMOS transistor 201 (in which the source and/or drain is floated) can be formed by simply cutting off the above-mentioned wires. Therefore, when the disconnected wire is required to be reconnected, the cut-off wiring can be connected again by use of FIB (Focused Ion Beam). In other words, it is possible to easily change the pull-down circuit 310 to the pull-up circuit. As a result, whenever the pull-down circuit 310 is required to be changed to the pull-up circuit, it is unnecessary to manufacture the semiconductor integrated circuit with the pull-down circuit from the beginning, so that the manufacturing cost of the semiconductor integrated circuit can be reduced.

The third preferred embodiment of the present invention will be described hereinbelow with reference to FIG. 5, in which a bidirectional buffer circuit having no pull-up and pull-down circuits is shown.

Figure 5:
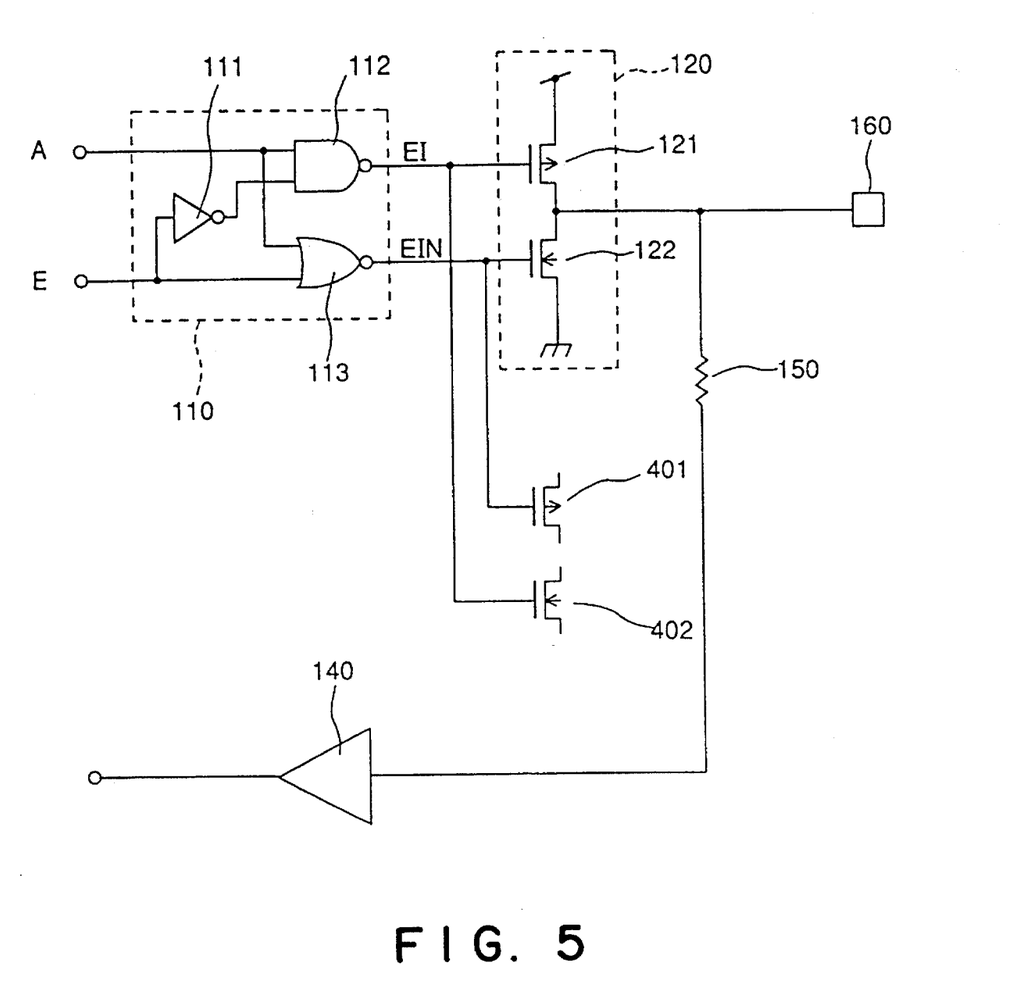
FIG. 5 is a circuit diagram showing the third preferred embodiment of the semiconductor integrated circuit according to the present invention, in which the bidirectional buffer circuit has no pull-up and pull-down circuit.

In FIG. 5, the same reference numerals have been retained for the similar composing elements which have the same functions as with the case shown in FIG. 2.

In FIG. 5, the gate of a PMOS transistor 401 (the third MOS transistor) is connected to the gate of the NMOS transistor 122 (the second MOS transistor) and its source and drain (at least one of them) are floated. Further, the gate of an NMOS transistor 402 (the fourth MOS transistor) is connected to the gate of the PMOS transistor 121 (the first MOS transistor) and its source and drain (at least one of them) are floated.

As described above, in the bidirectional circuit having no pull-up and pull-down circuits shown in FIG. 5, the gates of the inoperative MOS transistors 401 and 402 are connected to the gates of the MOS transistors 122 and 121, respectively, to apply only a load to the gates of the MOS transistors 122 and 121. As a result, it is possible to equalize the operating speed of the bidirectional buffer circuit shown in FIG. 5 to that of the bidirectional buffer circuit having the pull-up circuit (shown in FIG. 2) or the pull-down circuit (shown in FIG. 4).

When the bidirectional buffer circuit shown in FIG. 5 is manufactured, a circuit as shown in FIG. 3 is first formed on a semiconductor substrate. After that, in the circuit wiring shown in FIG. 3, the positions as shown by the lines A–A', B–B', C–C' and D–D' are all cut off, that is, the source of the PMOS transistor 202 (402) is cut away from the ground and its drain is cut away from the output terminal 160. Further, the source of the PMOS transistor 201 (401) is cut away from the voltage supply and its drain is cut away from the output terminal 160, to obtain the circuit construction as shown in FIG. 5. In this case, it is also sufficient when any one of the lines A–A' and B–B' and any one of the lines C–C' and D–D' are cut off.

As described above, after the wiring of the sources and the drains of the two MOS transistors 201 and 202 have been completed, the two MOS transistors 201 and 202 (in which the source and/or drain is floated) can be formed by simply cutting off the above-mentioned wires. Therefore, when the disconnected wires are required to be reconnected, the cut-off wiring can be connected again by use of FIB (Focused Ion Beam), in the same way as with the cases shown in FIGS. 2 and 4. In other words, it is possible to easily change the circuit shown in FIG. 5 having the MOS transistors 401 and 402 to any of the pull-up circuit as shown in FIG. 2 or the pull-down circuit as shown in FIG. 4. As a result, whenever the bidirectional circuit having no pull-up and pull-down circuits is required to be changed to the bidirectional buffer circuit having a pull-up or pull-down circuit, it is unnecessary to manufacture the semiconductor integrated circuit from the beginning, so that the manufacturing cost of the semiconductor integrated circuit can be reduced.

As described above, also in the third embodiment according to the present invention, it is possible to provide a semiconductor integrated circuit which is small in the power consumption, constant in the operating speed, and low in manufacturing cost.

The semiconductor integrated circuit as a modified example of the first preferred embodiment of the present invention will be described hereinbelow with reference to FIG. 6, in which a bidirectional buffer circuit having a pull-up circuit is shown.

Figure 6:
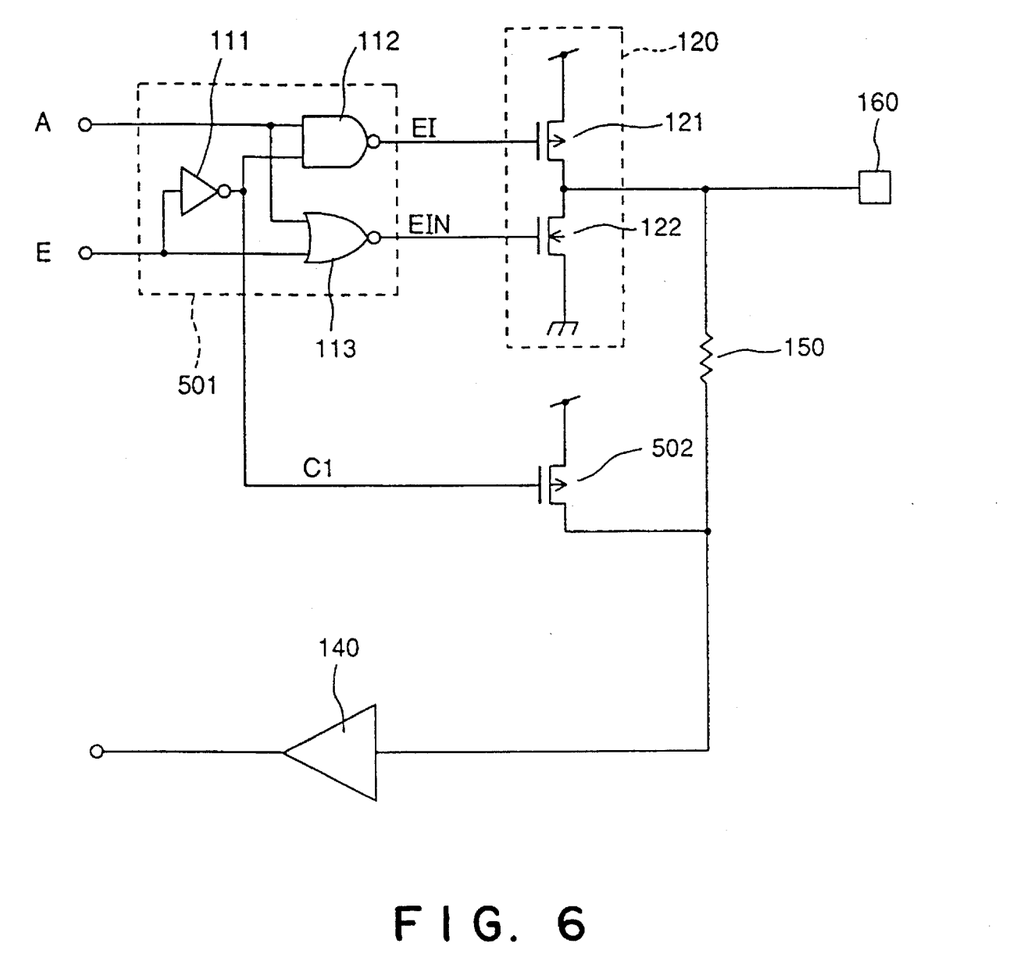
FIG. 6 is a circuit diagram showing a modified example embodiment of the semiconductor integrated circuit shown in FIG. 2.

In FIG. 6, the same reference numerals have been retained for the similar composing elements which have the same functions as with the case shown in FIG. 2.

In this example, the construction of a control circuit 501 is the same as with the case of the first embodiment shown in FIG. 2. However, this example is different from the first embodiment in that an output signal of the NOT circuit 111 is used as a control signal $C_1$.

In FIG. 6, the pull-up circuit is constructed by a PMOS transistor 502 (the third MOS transistor). The source of the PMOS transistor 502 is connected to the voltage supply, its drain is connected to the output terminal 160 via the resistor 150 and its gate is connected to the output of the NOT circuit 111 to accept the control signal $C_1$. Therefore, when the signal $C_1$ is at the low level, the PMOS transistor 502 is turned on, so that the supply potential supplied to its source is applied to the output terminal 160. On the other hand, when the signal $C_1$ is at the high level, the PMOS transistor 502 is turned off.

The operation of the bidirectional buffer circuit having the pull-up circuit shown in FIG. 6 will be described hereinbelow.

When the enable signal E is at the low level and when the input signal A is at the high level, the output signals EI and EIN of the control circuit 501 are both at the low level as already described, and the signal $C_1$ is at the high level. Therefore, the PMOS transistor 121 is turned on and the NMOS transistor 122 is turned off. Further, the PMOS transistor 502 is also turned off. As a result, the supply potential can be applied to the output terminal 160 through the PMOS transistors 121.

Further, when both the enable signal E and the input signal A are at the low level, the output signals EI, EIN and $C_1$ of the control circuit 501 are all at the high level. Thus, the PMOS transistor 121 is turned off, the NMOS transistor 122 is turned on and the PMOS transistor 502 is turned off. As a result, the ground potential can be applied to the output terminal 160 through the NMOS transistor 122.

Further, when the enable signal E is at the high level, the output signal EI of the control circuit 501 is at the high level and its output signal EIN is at the low level. Thus, the PMOS transistor 121 and the NMOS transistor 122 are both turned off. On the other hand, since the output signal $C_1$ is at the low level, the NMOS transistor 502 is turned on. Thus, the supply potential can be applied to the output terminal 160 through the NMOS transistor 502 to pull up the potential at the output terminal 160.

As described above, in the bidirectional buffer circuit having the pull-up circuit shown in FIG. 6, when the NMOS transistor 122 is turned on, the PMOS transistor 502 can be kept turned off. It is thus possible to eliminate the through current, as a result it is possible to reduce the power consumption of the circuit.

Further, in the bidirection buffer circuit having the pull-up circuit shown in FIG. 6, since the PMOS transistor 502 (the pull-up circuit) can be controllably turned on or off based on the control signal $C_1$ of the control circuit 501, no load is applied to the MOS transistor 122 of the output buffer circuit 120. This is different from the case of the first embodiment shown in FIG. 2, so that it is unnecessary to provide an additional NMOS transistor for equalization of the loads of the two MOS transistors 121 and 122 each other.

The integrated semiconductor circuit as a modified example of the second preferred embodiment of the present invention will be described hereinbelow with reference to FIG. 7, in which a bidirectional buffer circuit having a pull-down circuit is shown.

Figure 7:
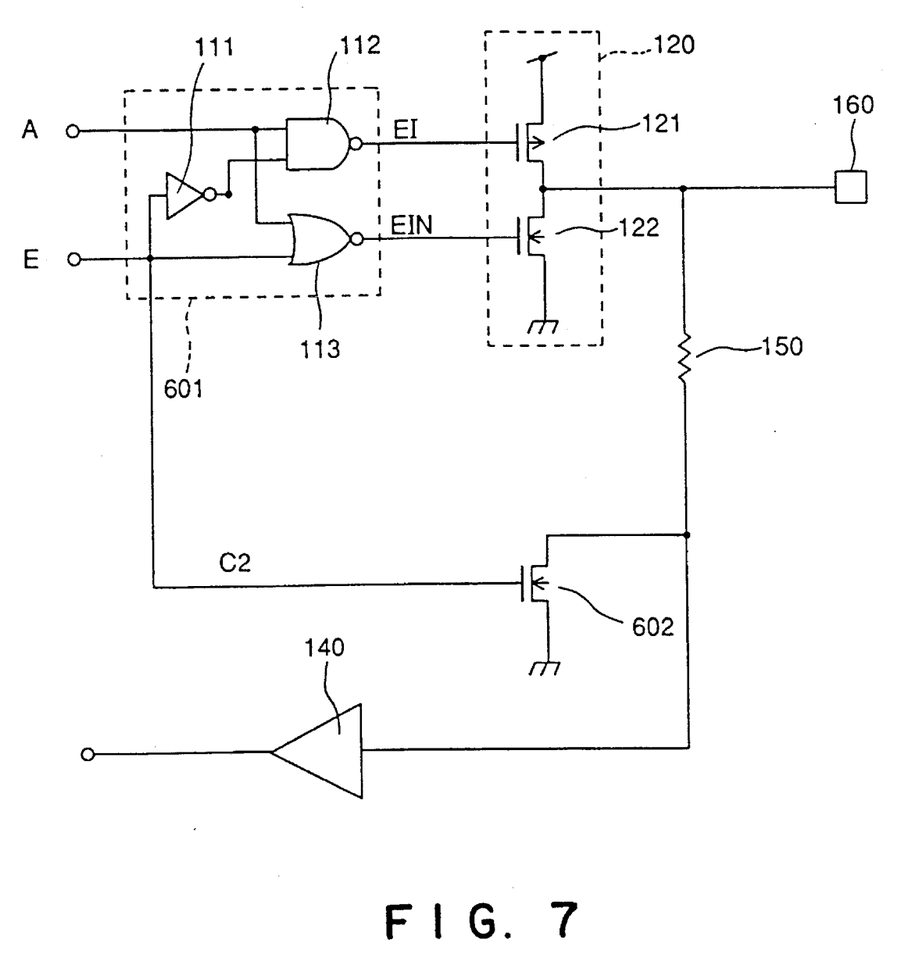
FIG. 7 is a circuit diagram showing a modified example of the semiconductor integrated circuit shown in FIG. 4.

In FIG. 7, the same reference numerals have been retained for the similar composing elements which have the same functions as with the case shown in FIG. 4.

In this example, the construction of a control circuit 601 is the same as with the case of the second embodiment shown in FIG. 4. However, this example is different from the second embodiment in that the enable signal E is used as an enable signal $C_2$ as it is.

Further, in FIG. 7, the pull-down circuit is constructed by an NMOS transistor 602 (the third MOS transistor). The source of the NMOS transistor 602 is connected to the ground (the first voltage supply) and its drain is connected to the output terminal 160 via the resistor 150. The enable signal E is applied as the control signal $C_2$ to the gate of the NMOS transistor 602. Therefore, when the signal $C_2$ is at the high level, the NMOS transistor 602 is turned on, so that the ground potential supplied to its source is applied to the output terminal 160. On the other hand, when the signal $C_2$ is at the low level, the NMOS transistor 602 is turned off.

The operation of the bidirectional buffer circuit having the pull-down circuit shown in FIG. 7 will be described hereinbelow.

When the enable signal E is at the low level and when the input signal A is at the high level, the output signals EI, EIN, and $C_2$ of the control circuit 602 are all at the low level. Therefore, the PMOS transistor 121 is turned on and the NMOS transistor 122 is turned off. Further, the NMOS transistor 602 is also turned off. As a result, the supply potential can be applied to the output terminal 160 through the PMOS transistors 121.

Further, when the enable signal E and the input signal A are both at the low level, the output signals EI and EIN of the control circuit 601 are at the high level, and the output signal $C_2$ is at the low level. Thus, the PMOS transistor 121 is turned off, the NMOS transistor 122 is turned on and the NMOS transistor 602 is turned off. As a result, the ground potential can be supplied to the output terminal 160 through the NMOS transistor 122.

Further, when the enable signal E is at the high level, since the output signal EI of the control circuit 601 is at the high level and its output signal EIN is at the low level. The PMOS transistor 121 and the NMOS transistor 122 are thus turned off. On the other hand, since the output signal $C_2$ is at the high level, the NMOS transistor 602 is turned on. Thus, the ground potential can be supplied to the output terminal 160 through the NMOS transistor 602 to pull down the potential at the output terminal 160.

As described above, in the bidirectional buffer circuit having the pull-down circuit shown in FIG. 7, when the PMOS transistor 121 is turned on, the NMOS transistor 602 can be kept turned off. It is thus possible to eliminate the through current, as a result it is possible to reduce the power consumption of the circuit.

Further, in this bidirectional buffer circuit having the pull-down circuit shown in FIG. 7, the NMOS transistor 602 (the pull-down circuit) can be controllably turned on or off based on the control signal $C_2$ of the control circuit 601. This is different from the case of the second embodiment shown in FIG. 4. No load is thus applied to the MOS transistor 122 of the output buffer circuit 120 and hence it is unnecessary to provide an additional PMOS transistor for equalization of the loads of the two MOS transistors 121 and 122 each other.

As described above, also in this modified example, it is possible to provide a semiconductor integrated circuit, which is small in the power consumption, constant in the operating speed, and low in the manufacturing cost.

Further, in the above-mentioned embodiments, the semiconductor integrated circuit has been described by taking the case of the bidirectional buffer circuit. Without being limited only thereto, however, the present invention can be of course applied to the semiconductor integrated circuit having only the output buffer circuit (having no input buffer circuit 140).

What is claimed is:

1. A semiconductor integrated circuit, comprising:

a first MOS transistor of a first-conductive type having a gate, a source connected to a first voltage supply and a drain connected to an output terminal;

a second MOS transistor of a second-conductive type different from the first-conductive type having a gate, a source connected to a second voltage supply different from the first voltage supply in potential and a drain connected to the output terminal;

a third MOS transistor of the first-conductive type having a gate connected to the gate of the second MOS transistor, a source connected to the first voltage supply and a drain connected to the output terminal;

a fourth MOS transistor of the second-conductive type having a source, a drain and a gate connected to the gate of the first MOS transistor, at least one of the source and drain being floated; and means, responsive to an enable signal and an input signal, for applying control signals to the gates of the first and second MOS transistors to turn on any one of the first and second MOS transistors based on the input signal level when the enable signal is on, whereas to turn off both the first and second MOS transistors irrespective of the input signal level when the enable signal is off.

2. The semiconductor integrated circuit of claim 1 further comprising means for applying a signal appearing at the output terminal to internal circuitry of the semiconductor integrated circuit.

3. The semiconductor integrated circuit of claim 1, the first and third MOS transistors are PMOS transistors and the second and fourth MOS transistors are NMOS transistors.

4. A semiconductor integrated circuit, comprising:

a first MOS transistor of a first-conductive type having a drain, a source connected to a first voltage supply and a drain connected to an output terminal;

a second MOS transistor of a second-conductive type different from the first-conductive type having a gate, a source connected to a second voltage supply different from the first voltage supply in potential and a drain connected to an output terminal;

a third MOS transistor of the first-conductive type having a source, a drain and a gate connected to the gate of the second MOS transistor, at least one of the source and drain being floated;

a fourth MOS transistor of the second-conductive type having a source, a drain and a gate connected to a gate of the first MOS transistor, at least one of the source and drain being floated; and means, responsive to an enable signal and an input signal, for applying control signals to the gates of the first and second MOS transistors to turn on any one of the first and second MOS transistors based on the input signal level when the enable signal is on, whereas to turn off both the first and second MOS transistors irrespective of the input signal level when the enable signal is off.

5. The semiconductor integrated circuit of claim 4 further comprising means for applying a signal appearing at the output terminal to internal circuitry of the semiconductor integrated circuit.

6. The semiconductor integrated circuit of claim 4, the first and third MOS transistors are PMOS transistors and the second and fourth MOS transistors are NMOS transistors.

7. A method of manufacturing a semiconductor integrated circuit including a first MOS transistor of a first-conductive type having a gate, a source connected to a first voltage supply and a drain connected to an output terminal, a second MOS transistor of a second-conductive type different from the first-conductive type having a gate, a source connected to a second voltage supply different from the first voltage supply in potential and a drain connected to the output terminal, a third MOS transistor of the first-conductive type having a gate connected to the gate of the second MOS transistor, a source connected to the first voltage supply and a drain connected to the output terminal and a fourth MOS transistor of the second-conductive type having a source connected to the second voltage supply, a drain connected to the output terminal and a gate connected to the gate of the first MOS transistor, the method comprising the step of:

cutting off at least one of wiring connected between the source of the third MOS transistor and the first voltage supply, wiring connected between the drain of the third MOS transistor and the output terminal, wiring connected between the source of the fourth MOS transistor and the second voltage supply, and wiring connected between the drain of the fourth MOS transistor and the output terminal.

8. A semiconductor integrated circuit, comprising:

a first PMOS transistor having a gate, a source connected to a voltage supply and a drain connected to an output terminal;

a first NMOS transistor having a gate, a source connected to a ground and a drain connected to the output terminal;

a second PMOS transistor having a gate connected to the gate of the first NMOS transistor, a source connected to the voltage supply and a drain connected to the output terminal via a resistor;

a second NMOS transistor having a source, a drain and a gate connected to the gate of the first PMOS transistor, at least one of the source and drain being floated;

a NAND gate having one input accepting an input signal and an output connected to the gate of the first PMOS transistor;

a NOR gate having one input connected to the one input of the NAND gate, an another input accepting an enable signal and an output connected to the gate of the first NMOS transistor; and an inverter having an input connected to the other input of the NOR gate and an output connected to an another input of the NAND gate, wherein any one of the first PMOS and NMOS transistors is turned on based on the input signal level when the enable signal is substantially at the ground level, whereas the first PMOS and NMOS transistors are both turned off irrespective of the input signal level when the enable signal is substantially at the supply voltage level.

9. The semiconductor integrated circuit of claim 4 further comprising an input buffer connected to the drain of the second PMOS transistor, for applying a signal appearing at the output terminal to internal circuitry of the semiconductor integrated circuit.

10. A semiconductor integrated circuit, comprising:

a first PMOS transistor having a gate, a source connected to a voltage supply and a drain connected to an output terminal;

a first NMOS transistor having a gate, a source connected to a ground and a drain connected to the output terminal;

a second PMOS transistor having a source, a drain and a gate connected to the gate of the first NMOS transistor, at least one of the source and drain being floated;

a second NMOS transistor having a gate connected to the gate of the first PMOS transistor, a source connected to the ground and a drain connected to the output terminal via a resistor;

a NAND gate having one input accepting an input signal and an output connected to the gate of the first PMOS transistor;

a NOR gate having one input connected to the one input of the NAND gate, an another input accepting an enable signal and an output connected to the gate of the first NMOS transistor; and an inverter having an input connected to the other input of the NOR gate and an output connected to the an another input of the NAND gate, wherein any one of the first PMOS and NMOS transistors is turned on based on the input signal level when the enable signal is substantially at the ground level, whereas the first PMOS and NMOS transistors are both turned off irrespective of the input signal level when the enable signal is substantially at the supply voltage level.

11. The semiconductor integrated circuit of claim 10 further comprising an input buffer connected to the drain of the second NMOS transistor, for applying a signal appearing at the output terminal to internal circuitry of the semiconductor integrated circuit.

12. A semiconductor integrated circuit, comprising:

a first PMOS transistor having a gate, a source connected to a voltage supply and a drain connected to an output terminal;

a first NMOS transistor having a gate, a source connected to a ground and a drain connected to the output terminal;

a second PMOS transistor having a source, a drain and a gate connected to the gate of the first NMOS transistor, at least one of the source and drain being floated;

a second NMOS transistor having a source, a drain and a gate connected to the gate of the first PMOS transistor, at least one of the source and drain being floated;

a NAND gate having one input accepting an input signal and an output connected to the gate of the first PMOS transistor;

a NOR gate having one input connected to the one input of the NAND gate, an another input accepting an enable signal and an output connected to the gate of the first NMOS transistor; and an inverter having an input connected to the other input of the NOR gate and an output connected to an another input of the NAND gate, wherein any one of the first PMOS and NMOS transistors is turned on based on the input signal level when the enable signal is substantially at the ground level, whereas the first PMOS and NMOS transistors are both turned off irrespective of the input signal level when the enable signal is substantially at the supply voltage level.

13. The semiconductor integrated circuit of claim 12 further comprising an input buffer connected to the output terminal via a resistor, for applying a signal appearing at the output terminal to internal circuitry of the semiconductor integrated circuit.

* * * * *